United States Patent [19]

Watanabe

[11] Patent Number: 4,659,449
[45] Date of Patent: Apr. 21, 1987

[54] APPARATUS FOR CARRYING OUT DRY ETCHING

[75] Inventor: Toru Watanabe, Yokohama, Japan

[73] Assignee: Kabushiki Kaisha Toshiba, Kawasaki, Japan

[21] Appl. No.: 804,043

[22] Filed: Dec. 3, 1985

[30] Foreign Application Priority Data

Dec. 6, 1984 [JP] Japan ................. 59-258134

[51] Int. Cl.$^4$ ............................................. C23F 1/02
[52] U.S. Cl. ................................. 204/298; 156/345; 250/492.3
[58] Field of Search .............. 204/192 R, 298, 192 E; 156/345, 643, 646; 250/492.2, 492.21, 492.3

[56] References Cited

U.S. PATENT DOCUMENTS

| | | | |
|---|---|---|---|
| 4,450,031 | 5/1984 | Ono et al. | 204/298 X |
| 4,478,677 | 10/1984 | Chen et al. | 156/345 X |
| 4,481,062 | 11/1984 | Kaufman et al. | 156/345 |
| 4,496,449 | 1/1985 | Rocca et al. | 204/298 X |
| 4,529,475 | 7/1985 | Okano et al. | 204/298 X |

OTHER PUBLICATIONS

M. W. Geis et al, "A Novel Anisotropic Dry Etching Technique", J. Vac. Sci. Technol. 19(4), Nov./Dec. 1981, pp. 1390–1393.

Primary Examiner—John F. Niebling
Assistant Examiner—Nam X. Nguyen
Attorney, Agent, or Firm—Schwartz, Jeffery, Schwaab, Mack, Blumenthal & Evans

[57] ABSTRACT

A dry etching apparatus according to the present invention is characterized in that an etching process is applied to a sample by using both physical etching means and chemical etching means. To perform such an etching process, the dry etching apparatus is provided with a chamber for accommodating a sample to be etched, a suction unit for reducing a pressure within the chamber, a gas introducing unit for introducing a reactive gas from the external into said chamber, an excitation unit to excite the reactive gas for producing activated species allowing the sample to be etched due to chemical reaction, and an ion irradiation unit for irradiating ions to the sample, thereby making it possible to independently control the energy or density of ions and the density of the activated species, thus setting optimum etching conditions in conformity with a material to be etched or an etching pattern.

12 Claims, 10 Drawing Figures

APPARATUS FOR CARRYING OUT DRY ETCHING

BACKGROUND OF THE INVENTION

The present invention relates to an apparatus for carrying out dry etching, and more particularly to a dry etching apparatus used for forming patterns of semiconductor integrated circuits.

In the fabrication of semiconductor devices, particularly LSI circuits, a dry etching process is necessarily required. Such a dry etching process is roughly classified into a method based on physical reaction and a method based on chemical reaction. A typical method of the former is a sputter etching method and a typical method of the latter is a CDE (Chemical Dry Etching) method.

TABLE 1

| Etching Reaction | ← Physical reaction | | Chemical reaction → | |
|---|---|---|---|---|
| Etching method | Sputter etching. | RIBE, | RIE, | Plasma etching, | CDE |
| Etching characteristic | ← Good anisotropy Poor selectivity | | | Poor anisotropy → Good selectivity | |
| Damage | ← Large | | | Small → | |
| Sample | $SiO_2$, | Si, | | Doped Si, | Al |

As indicated in Table 1, etching methods of intermediate characteristics therebetween are RIBE (Reactive Ion Beam Etching) method, RIE (Reactive Ion Etching) method, plasma etching method, etc. A study is made to compare the method based on the physical reaction with the method based on the chemical reaction in connection with the etching characteristic. Since the former method is an etching due to irradiation of ion beam etc., a reaction proceeds along an ion advancing direction, resulting in good anisotropy, but sputtering yields (the numbers of target atoms removed per one incident particle) between materials are not different from each other to much extent, resulting in poor selectivity therebetween. In contrast, since the latter method is an etching utilizing chemical reaction due to activated species, the activated species are isotropically diffused. As a result, anisotropy becomes poor, but the reaction is greatly varied depending upon kinds of activated species and samples, resulting in good selectivity. Further, in regard to damages to the sample, even when either method is employed, the surface of the sample is damaged by the exposure to ion beam or plasma. However, the degree of the damage by the method based on physical reaction is larger than that by the method based on chemical reaction. The method based on physical reaction is mainly used for etching the sample, e.g., $SiO_2$ or Si, etc. and the method based on chemical reaction is mainly used for etching the sample, e.g., doped Si or Al, etc.

The etching employed in the manufacturing processes for LSI has the following three requirements. First is that anisotropy is excellent. Second is that selection ratio between materials is large. Third is small damage. The first requirement is necessarily required for high precision dimension control. In the recent LSI, pattern formation of the circuit dimension of approximately 1 $\mu$m is required. To effect an etching faithful to a resist pattern as a mask, etching having excellent anisotropy is required. The second requirement on the selectivity is necessarily required for etching integrated semiconductor devices. A gate oxide film increasingly becomes thin and the employment of a shallow junction as a junction layer of a semiconductor is now generalized. For instance, in case where there arises a need such that a gate oxide film is left to remove other layers by etching, an employment of an etching process having poor selectivity results in the fact that even the gate oxide film is removed. As a result, there is a possibility that there occurs an opening in the gate oxide film. Thus, according as the integration is developed, an etching process having higher selectivity is required. In addition, in regard to the third requirement on the damage, an etching method having less damage is desired for the same reason stated above.

However, the above-mentioned both methods have advantages and disadvantages, viz., the etching process based on physical reaction has good anisotropy but poor selectivity, whereas the etching process based on chemical reaction has good selectivity but poor anisotropy. On the other hand, with other processes, e.g., RIBE, RIE and plasma etching, etc. which lie in the middle of the above-mentioned two methods, it can be said that they stand on an appreciable point of compromise but fail to provide excellent anisotropy or excellent selectivity. Further, these methods cannot control an energy or density of ions independent of other parameters, e.g., density of activated species, etc., failing to provide optimum etching conditions. For instance, the reduction of an energy of ions solely depends upon an indirect method, e.g., a method of lowering a high frequency power used for excitation of activated species, a method of raising a pressure within a chamber or the like. Thus, this results in changes in other etching conditions.

As stated above, the drawback with the above-mentioned conventional dry etching apparatus is that it is unable to set optimum etching conditions depending upon the quality of the sample to be etched or an etching pattern.

SUMMARY OF THE INVENTION

With the above in view, an object of the present invention is to provide an apparatus for carrying out dry etching, which makes it possible to set optimum etching conditions depending upon the quality of the sample to be etched and the etching pattern.

An apparatus for carrying out dry etching according to the present invention is characterized in that there are provided a chamber for accommodating a sample to be etched, a suction unit for reducing a pressure within the chamber, a gas introducing unit for introducing reactive gas from the external into the chamber, an exciter to excite the reactive gas in order to generate activated species for etching the sample due to chemical reaction, and an ion irradiating unit for irradiating ions to the sample, thereby making it possible to independently control an energy or a density of the ions and a density of the activated species, thus setting optimum etching conditions depending upon the quality of the sample to be etched or the etching pattern.

DETAILED DESCRIPTION OF THE PREFERRED EMBODIMENTS

The present invention will be described in detail in conjunction with preferred embodiments illustrated.

Figure 1:
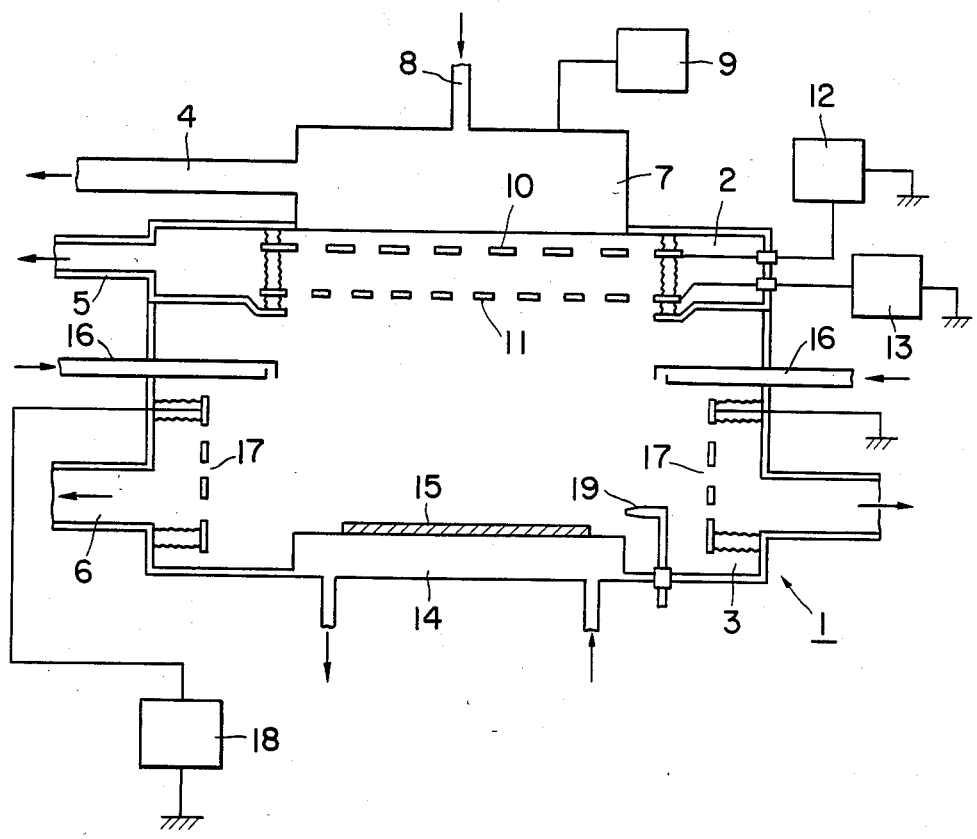
FIG. 1 is a diagrammatical view illustrating an embodiment of a dry etching apparatus according to the present invention.

Referring to FIG. 1, there is shown an embodiment of a dry etching apparatus according to the present invention. A chamber 1 comprises an upper chamber 2 and a lower chamber 3 as shown. The upper chamber 2 and the lower chamber 3 are evacuated by a vacuum pump (not shown) through evacuating holes 4 and 5 and through an evacuating hole 6, respectively, thus maintaining a pressure within the chamber 1 constant. The upper chamber 2 is provided at the upper portion thereof with an ionization gun 7 of a large diameter, which ionizes an ion source gas introduced from a gas inlet tube 8 by a power supplied from a power supply unit 9. Below the ionization gun 7, there is provided an insulated multistage grid electrode (only the first stage grid electrode 10 and the final stage grid electrode 11 are illustrated in the figure). To the grid electrodes, voltages are applied by means of DC power sources 12 and 13, respectively. The voltage applied to the first stage grid electrode 10 functions as an ionization voltage and the voltage applied to the final stage grid electrode 11 functions as an ion acceleration control voltage. The lower chamber 3 is provided with a temperature controlled support 14 on which a sample to be etched, e.g., a Si wafer 15 comprising various kinds of stacked layers, is mounted. The chamber 1 is provided in the middle thereof with two gas inlets 16. Reactive gas introduced from each gas inlet tube 16 is filled within the lower chamber 3. The lower chamber 3 is provided with a pair of opposite electrodes 17. To the electrode 17 positioned left in the figure, a high frequency voltage is applied to produce glow discharge between the opposite electrodes 17. This glow discharge allows the reactive gas introduced to be excited. On the one side of the support 14, an electron gun 19 is provided. This electron gun 19 is used, when an insulating material is employed as the sample, for neutralizing ions produced due to ion irradiation to prevent charge-up of the sample.

In accordance with the apparatus of the invention, an etching based on physical reaction is carried out by ion beam generated within the upper chamber 2. As ion source gas, rare gas, e.g., He or Ar, etc., halogen gas, e.g., $Cl_2$ or a $CF_4$ or mixture of rare gas and halogen gas is preferably used. Energy and density of the ion beam may be desirably adjustable by varying an amount of gas to be introduced and a voltage applied to each grid electrode. The apparatus in this embodiment can produce ion beam of 0.1 $A/cm^2$ as the maximum value and desirably control ion acceleration voltage within a range from 0 to 1 KV.

On the other hand, etching based on chemical reaction is carried out by causing discharge between the opposite electrodes 17 to change reactive gas introduced into the lower chamber 3 into an activated species, e.g., radical or plasma, etc. In this instance, halogen gas, e.g., $Cl_2$ or $CF_4$, etc. may be used as the reactive gas. The density of the activated species can be independently controlled by adjusting high frequency applied to either of the opposite electrodes.

Figure 2:
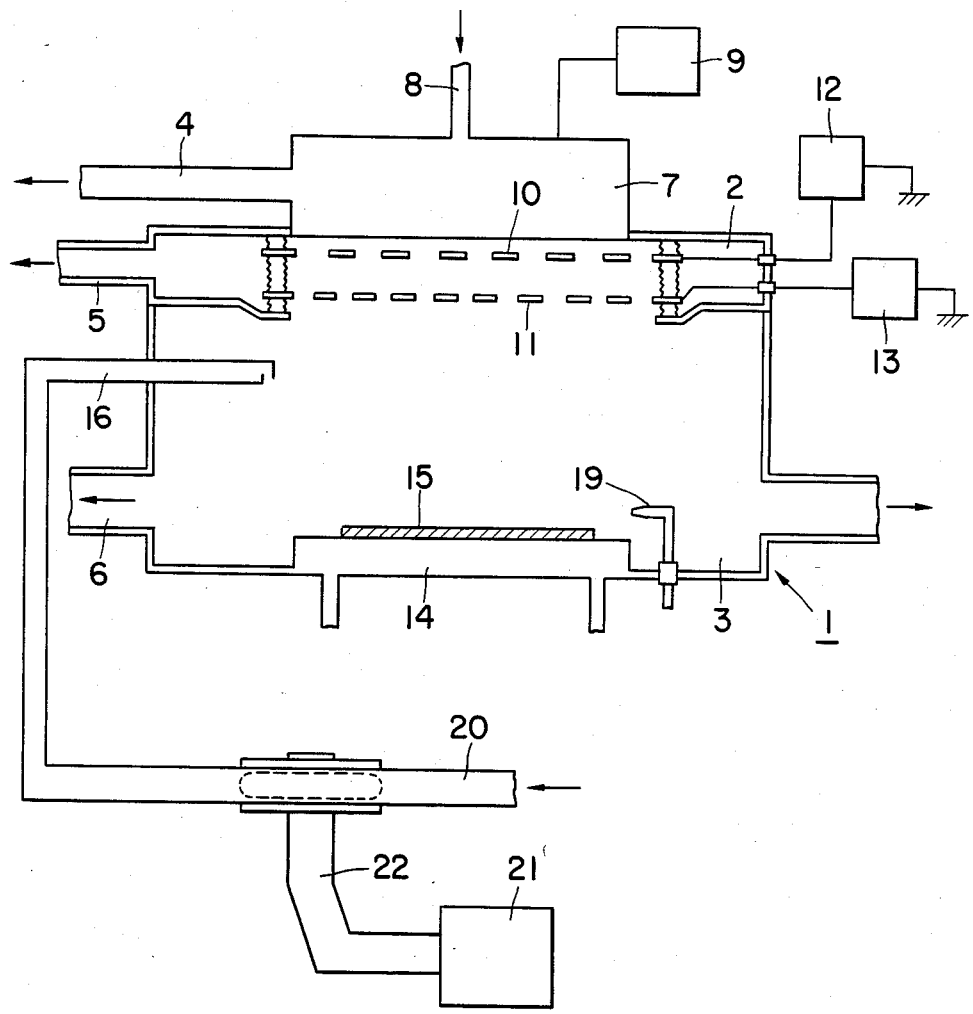
FIG. 2 is a diagrammatical view illustrating another embodiment of a dry etching apparatus according to the present invention.

FIG. 2 is a diagrammatical view illustrating another embodiment of a dry etching apparatus according to the present invention. This embodiment differs from the first-mentioned embodiment only in the structure for feeding reactive gas into the lower chamber 3. Other parts in this embodiment are identical to those in the above-mentioned embodiment. Accordingly, these parts are denoted by the same reference numerals, respectively, and therefore their explanation will be omitted. The apparatus is provided outside of the chamber 1 with a gas supply unit comprising a gas inlet tube 20 from which reactive gas is introduced, a microwave generator 21 for generating microwaves, and a waveguide 22 joined to the microwave generator 21, whereby the microwave generated in the microwave generator 21 is applied to the reactive gas through the waveguide 22. By the energy of the microwaves, an activated species is produced within the reactive gas introduced. The activated species thus produced is delivered to the lower chamber 3 through the gas inlet tube 16. The density of the activated species can be controlled by adjusting the microwave power.

As stated above, the dry etching apparatus according to the present invention makes it possible to control energy or density of ion beam contributing to physical reaction and density of the active species contributing to chemical reaction in an independent fashion to set optimum etching conditions. Namely, as shown in Table 2, a control is effected to independently vary parameters, respectively, thus making it possible to continuously set etching conditions from the range where the physical reaction is dominant to the range where the chemical reaction is dominant.

TABLE 2

| Parameter | Reactive Mode | | |
|---|---|---|---|
| | ← Physical reaction | | Chemical reaction → |
| Ion source gas | Rare gas | Reactive gas | Non |
| Ion current | Large | Small | Non |
| Ion acceleration voltage | Large | Small | Non |
| Activated species source gas | Non | Reactive gas | Reactive gas |
| High frequency power for generating activated | Non | Small | Large |

TABLE 2-continued

| Parameter | Reactive Mode | |
|---|---|---|
| | ← Physical reaction | Chemical reaction → |
| species | | |

When, e.g., rare gas is employed as ion source gas, the physical reaction becomes dominant. By mixing reactive gas, e.g., halogen, etc. into such a reactive system, it is possible to increase the ratio of the chemical reaction. Further, by increasing ion current and ion acceleration voltage, the physical reaction becomes dominant. In contrast, by decreasing them, the chemical reaction becomes dominant. Furthermore, by ceasing the irradiation of the ion beam, there occurs a condition where only the chemical reaction exclusively exists. In contrast, by ceasing both introduction of the activated species source gas and an application of high frequency, there occurs condition where only the physical reaction due to the radiation of the ion beam exists. In addition, by introducing a reactive gas as the activated species source gas and increasing high frequency power applied, the chemical reaction becomes dominant.

Figure 3A:
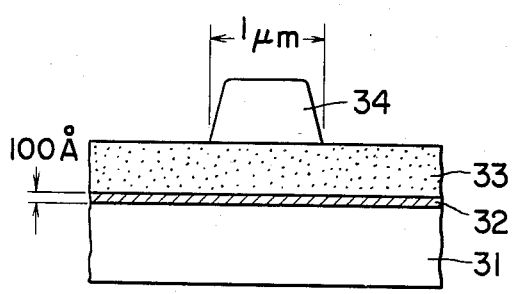
FIGS. 3a to 3g are cross sectional views showing etching processes carried out with the dry etching apparatus according to the present invention.
Figure 3B:
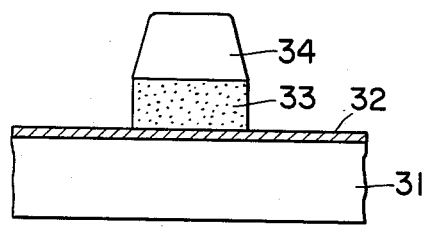
Figure 3F:
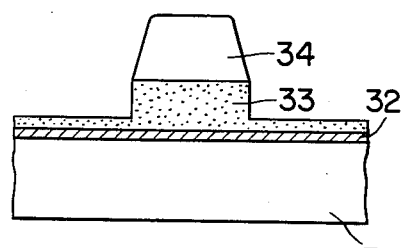
Figure 4:
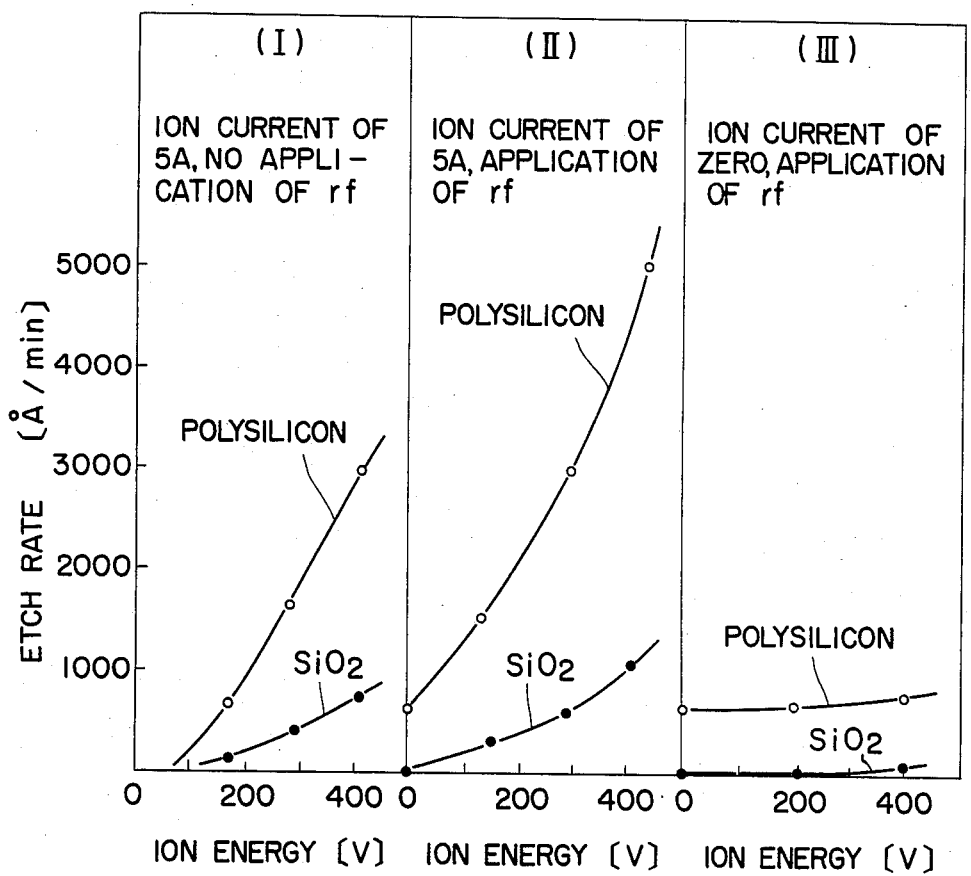
FIG. 4 is a graph showing the relationship between an etch rate and an ion energy by using an ion current and a high frequency applied to the electrode 17 which is shown in FIG. 1 as parameters.

An example of etching process performed with a dry etching apparatus according to the present invention will be described. This example indicates that an etching process is applied to a semiconductor device as shown in FIG. 3a to produce a semiconductor device shown in FIG. 3b wherein the semiconductor device comprises a semiconductor substrate 31, a thin gate oxide film 32 (of 100 Å in thickness) and a polysilicon layer 33 stacked in succession on the semiconductor substrate 31, and a resist pattern of approximately 1 μm in width formed on the polysilicon layer 33. It is assumed that the three etching conditions are set in the dry etching apparatus according to the present invention. FIG. 4 is a graph showing etch rates in these three conditions (I), (II) and (III). According to this graph, there is illustrated the relationship between energy of ion beam and the etch rates when a polysilicon and $SiO_2$ are employed as samples in connection with each condition. The first condition (I) is set for carrying out etching based on physical reaction wherein the setting is made such that the value of an ion current (governing ion density) is 5A and there is no application of high frequency or r.f. to the electrode to be powered within the lower chamber 3. Namely, in accordance with the first condition (I), the etching due to ion beam becomes dominant instead of the etching due to the activated species. Accordingly, the anisotropy becomes desirable whereas the selectivity is degraded. As indicated by the graph, the ratio of polysilicon and $SiO_2$ (the ratio of etch rates thereof) represents a value from 2 to 3. In contrast, the third condition (III) is set for carrying out etching based on chemical reaction wherein the setting is made such that there is no ion current and no application of high frequency to the electrode to be powered within the lower chamber 3. Namely, in accordance with the third condition (III), the etching due to activated species becomes dominant instead of the etching due to ion beam. Accordingly, the anisotropy is degraded whereas the selectivity becomes high. As indicated by the graph, the ratio of polysilicon and $SiO_2$ represents more than ten. In addition, the second condition (II) is set for carrying out both the physical reaction and the chemical reaction wherein the setting is made such that the value of the ion current is 5A and there is application of high frequency to the electrode to be powered within the lower chamber 3. This second condition (II) represents intermediate nature between the conditions (I) and (III) in regard to both the anisotropy and selectivity.

Figure 3E:
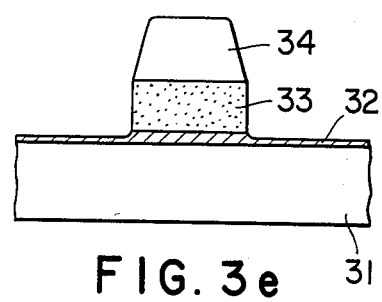
Figure 3C:
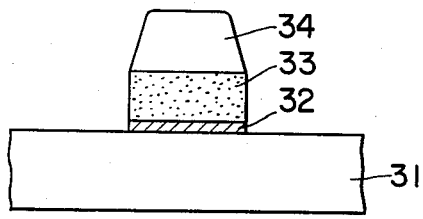
Figure 3G:
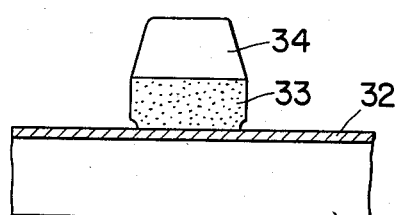
Figure 3D:
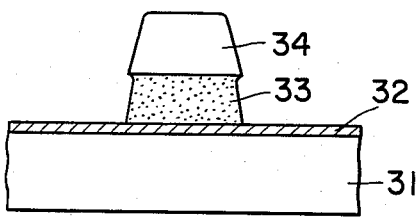

Initially, when an etching process is applied to the semiconductor device shown in FIG. 3a in accordance with the first condition (I), a semiconductor device as shown in FIG. 3c is obtained. The semiconductor device which has undergone such an etching process has an excellent anisotropy. Accordingly, there is no possibility that the polysilicon layer 33 is subject to erosion below the resist pattern 34. However, since it has low selectivity, not only the polysilicon layer 33 but also the gate oxide film 32 are removed by the etching process. Likewise, when an etching process is applied to the semiconductor device shown in FIG. 3a in accordance with the third condition (III), a semiconductor device as shown in FIG. 3d is obtained. Since the semiconductor device thus obtained has an excellent selectivity, the gate oxide film 32 is not etched. However, since it has poor anisotropy, isotropic etching is carried out, with the result that the polysilicon layer 33 is subject to erosion below the resist pattern 34. Likewise, when an etching process is applied to the semiconductor device shown in FIG. 3a in accordance with the condition (II), a semiconductor device as shown in FIG. 3e is obtained in accordance with a condition obtained as a compromise between the conditions (I) and (III). In view of this, a modified etching process is conducted in order to realize a desired structure as shown in FIG. 3b by varying the setting of the conditions in the middle of the etching process. Namely, an etching process is initiated in accordance with the condition (I) to change into an etching based on the condition (III) at time when an etching process applied to the polysilicon layer 33 is not completely finished. Thus, this makes it possible to carry out an etching representing an excellent anisotropy at the first part of the etching and to carry out an etching representing an excellent selectivity at the latter part thereof. Accordingly, a semiconductor device of a structure shown in FIG. 3g is realized, thus making it possible to perform substantially desired etching.

One example of use of the dry etching apparatus according to the present invention has been described. In addition, by varying various parameters shown in Table 2, a wide variety of uses can be realized.

As stated above, the dry etching apparatus according to the present invention is configured so that energy or density of ions and density of activated species can be independently controlled. Thus, this enables setting of optimum conditions in conformity with a quality of sample to be etched and an etching pattern to carry out a desired etching process.

What is claimed is:
1. A dry etching apparatus comprising:
 (a) a chamber for accompanying a sample to be etched;
 (b) a suction unit for reducing a pressure within said chamber;
 (c) a gas introducing unit for introducing at least one of a reactive gas and a nonreactive gas into said chamber;

(d) opposite electrodes disposed in said chamber across which is applied a high frequency voltage to excite said reactive gas for generating activated species allowing said sample to be etched due to chemical reaction;

(e) an ion irradiation unit for irradiating ions, said sample being etched due to physical reaction of an ion beam formed by said ions; and (f) means for varying the energy and density of said ion beam, and the density of said activated species, to thereby control the relative amounts of said physical reaction and said chemical reaction.

2. A dry etching apparatus as set forth in claim 1, wherein said reactive gas is a halogen compound, and said activated species is a radical or plasma thereof.

3. A dry etching apparatus as set forth in claim 2, wherein said reactive gas is a gas containing chloride (Cl) or a fluorine (F) and said activated species is a radical or plasma thereof.

4. A dry etching apparatus as set forth in claim 1, wherein said ions are ions of a rare gas or a gas of a halogen compound, or a mixture of said rare gas and said halogen compound.

5. A dry etching apparatus as set forth in claim 4, wherein said ions are ions of helium (He) or argon (Ar).

6. A dry etching apparatus as set forth in claim 4, wherein said ions are ions of a gas containing a chloride (Cl) or a fluorine (F).

7. A dry etching apparatus comprising:
(a) a chamber for accompanying a sample to be etched;

(b) a suction unit for reducing a pressure within said chamber;

(c) a gas introducing unit for introducing a reactive gas into said chamber;

(d) an excitation unit associated with said gas introducing unit for applying a microwave to excite said reactive gas for generating activated species allowing said sample to be etched due to chemical reaction; and (e) an ion irradiation unit for irradiating ions, said sample being etched due to physical reaction by an ion beam formed by said ions; and (f) means for varying the energy and density of said ion beam, and the density of said activated species, to thereby control the relative amounts of said physical reaction and said chemical reaction.

8. A dry etching apparatus as set forth in claim 7, wherein said reactive gas is a gas of halogen compound, and said activated species is a radical or plasma thereof.

9. A dry etching apparatus as set forth in claim 8, wherein said reactive gas is a gas containing chloride (Cl) or fluorine (F) and said activated species is a radical or plasma thereof.

10. A dry etching apparatus as set forth in claim 8, wherein said ions are ions of a rare gas or a gas of a halogen compound, or a mixture of said rare gas and said halogen compound.

11. A dry etching apparatus as set forth in claim 10, wherein said ions are ions of helium (He) or argon (Ar).

12. A dry etching apparatus as set forth in claim 10, wherein said ions are ions of a gas containing chloride (Cl) or fluorine (F).

* * * * *